US012641731B2

(12) United States Patent
Tang et al.

(10) Patent No.: US 12,641,731 B2
(45) Date of Patent: May 26, 2026

(54) METHOD FOR MANUFACTURING CONDUCTIVE CIRCUIT BOARD

(71) Applicant: Tong Hsing Electronic Industries, Ltd., Taipei City (TW)

(72) Inventors: Yueh-Kai Tang, Taipei City (TW); Chia-Shuai Chang, Taipei City (TW); Ming-Yen Pan, Taipei City (TW); Jian-Yu Shih, Taipei City (TW); Jhih-Wei Lai, Taipei City (TW); Shih-Han Wu, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 916 days.

(21) Appl. No.: 17/952,015

(22) Filed: Sep. 23, 2022

(65) Prior Publication Data

US 2024/0032204 A1 Jan. 25, 2024

(30) Foreign Application Priority Data

Jul. 21, 2022 (TW) .................................. 111127419

(51) Int. Cl.
*H05K 3/06* (2006.01)
*H05K 1/03* (2006.01)
*H05K 3/42* (2006.01)

(52) U.S. Cl.
CPC ............. *H05K 3/06* (2013.01); *H05K 1/0353* (2013.01); *H05K 3/423* (2013.01); *H05K 2201/09545* (2013.01); *H05K 2203/0723* (2013.01); *H05K 2203/107* (2013.01); *H05K 2203/1377* (2013.01)

(58) Field of Classification Search
CPC .. H05K 3/06; H05K 3/423; H05K 2203/0723; H05K 2203/107; H05K 2203/1377; H05K 3/027; H05K 3/0002; H05K 3/0044; H05K 3/0047; H05K 3/146; H05K 1/0353; H05K 1/0306; H05K 2201/09545; Y10T 29/49156; Y10T 29/49167
See application file for complete search history.

(56) References Cited

U.S. PATENT DOCUMENTS

| | | | | |
|---|---|---|---|---|
| 8,164,004 | B2 * | 4/2012 | Chen ...................... | H05K 3/107 174/262 |
| 8,698,003 | B2 * | 4/2014 | Yoshioka ............... | H05K 3/107 29/829 |
| 2004/0251047 | A1 * | 12/2004 | Bartley .................. | H05K 3/403 29/852 |

* cited by examiner

*Primary Examiner* — Donghai D Nguyen
(74) *Attorney, Agent, or Firm* — Li & Cai Intellectual Property Office

(57) ABSTRACT

A method for manufacturing a conductive circuit board includes the steps of: (a) preparing a substrate having opposite upper and lower surfaces, and at least one through hole extending through the upper and lower surfaces and defined by an inner surface; (b) forming a metal base layer on at least one of the upper and lower surfaces and on the inner surface; (c) etching the metal base layer by a laser beam so that the at least one of the upper and lower surfaces and the inner surface are formed with a patterned metal base layer; and (d) forming a metal circuit layer on the at least one of the upper and lower surfaces and on the inner surface to increase a thickness of the patterned metal base layer. A conductive circuit board manufactured therefrom is also enclosed.

10 Claims, 10 Drawing Sheets

METHOD FOR MANUFACTURING CONDUCTIVE CIRCUIT BOARD

CROSS-REFERENCE TO RELATED APPLICATION

This application claims priority to Taiwanese Invention Patent Application No. 111127419, filed on Jul. 21, 2022.

FIELD

The disclosure relates to a method for manufacturing a conductive circuit board and a conductive circuit board made therefrom.

BACKGROUND

The demand for high power light emitting diode (LED) has multiplied in recent years, so that ceramic circuit boards with good heat dissipation have also attracted the attention of the lighting industry. In the related technology industry of ceramic circuit boards, direct plated copper (DPC) substrates are widely favored by the industry.

Referring to FIGS. 1A to 1G, an existing method for manufacturing a DPC substrate includes steps (A) to (G).

In step (A), with reference to FIG. 1A, a ceramic substrate 10 is formed with a plurality of through holes 100 (only one through hole 100 is shown in FIGS. 1A to 1G to simplify the drawings) that extend through an upper surface 101 and a lower surface 102 thereof by laser drilling. Each through hole 100 is defined by an inner surface 1001. In step (B), with reference to FIG. 1B, a metal base layer 111 is sputtered on the ceramic substrate 10 to cover the upper and lower surfaces 101 and 102 of the ceramic substrate 10 and the inner surfaces 1001 defining the through holes 100.

In step (C), with reference to FIG. 1C, a patterned dry film 12 having a predetermined pattern is covered on the metal base layer 111 by photolithography. The predetermined pattern of the patterned dry film 12 can expose portions 1111 of the metal base layer 111 corresponding to the upper and lower surfaces 101 and 102 of the ceramic substrate 10. In step (D), with reference to FIG. 1D, a patterned copper plating layer 13 is directly plated on the metal base layer 111 to increase the thickness thereof.

In step (E), with reference to FIG. 1E, the patterned strip film 12 is stripped from the metal base layer 111 to expose another portions 1112 of the metal base layer 111 covered by the same. In step (F), with reference to FIG. 1F, the another portions 1112 of the metal base layer 111 are etched, so that each portion 1111 of the metal base layer 111 forms a patterned metal base layer 11 that partially exposes a corresponding one of the upper and lower surfaces 101 and 102 of the ceramic substrate 10. The patterned metal base layer 11 and the patterned copper plating layer 13 located at each portion 1111 of the metal base layer 111 together form a patterned metal circuit layer 14. In step (G), with reference to FIG. 1G, a metal protective layer 15 is electroplated on the patterned metal circuit layer 14.

Although the existing method for manufacturing a DPC substrate can achieve the purpose of forming the patterned metal circuit layer 14 and the metal protective layer 15 on the ceramic substrate 10, to complete the patterned metal circuit layer 14, apart from the need to perform the yellow light lithography process in step (C), there is still the need to strip the patterned dry film 12 in step (E) and to etch away the another portions 1112 of the metal base layer 111 in step (F), only then can the patterned metal base layer 11 and the patterned copper plating layer 13 together form the patterned metal circuit layer 14. It is well known to those skilled in the related technical field of DPC that the yellow light lithography process described in step (C) must go through the following three substeps: (C1) attaching a dry film; (C2) covering the dry film with a photomask to expose the dry film through an exposure machine; and (C3) developing the exposed dry film to obtain the patterned dry film 12. Through the aforesaid description, it is apparent that, in order to complete the patterned metal circuit layer 14, multiple steps must be performed, so that the manufacturing process of the existing method is very complicated.

Furthermore, it should be noted that a predetermined pattern defining the patterned metal circuit layer 14 is designed according to the application requirements of the downstream industry. However, the patterned metal circuit layer 14 can only expose partial areas of the upper and lower surfaces 101 and 102 of the ceramic substrate 10, but not the inner surfaces 1001. Therefore, the patterned metal circuit layer 14 cannot meet the requirements of circuit design for the relevant manufacturers who need to design circuit patterns in the through holes 100 of the ceramic substrate 10.

SUMMARY

Therefore, an object of the present disclosure is to provide a method for manufacturing a conductive circuit board that can simplify the production process and meet the needs of the industry in circuit design.

According to this disclosure, the method for manufacturing a conductive circuit board comprises the steps of:

(a) preparing a substrate having opposite upper and lower surfaces, and at least one through hole extending through the upper and lower surfaces and defined by an inner surface;

(b) forming a metal base layer on at least one of the upper and lower surfaces of the substrate and on the inner surface;

(c) etching the metal base layer formed on at least one of the upper and lower surfaces of the substrate and on the inner surface by a laser beam, so that the at least one of the upper and lower surfaces of the substrate and the inner surface are formed with a patterned metal base layer having a predetermined pattern for exposing a portion of the at least one of the upper and lower surfaces of the substrate and a portion of the inner surface; and (d) forming a metal circuit layer on the at least one of the upper and lower surfaces of the substrate and on the inner surface to increase a thickness of the patterned metal base layer formed on the at least one of the upper and lower surfaces of the substrate and on the inner surface.

Another object of this disclosure is to provide a conductive circuit board manufactured from the above method.

According to this disclosure, the conductive circuit board includes a substrate and a metal circuit layer. The substrate has opposite upper and lower surfaces, and at least one through hole extending through the upper and lower surfaces and defined by an inner surface. The metal circuit layer is formed on the at least one of the upper and lower surfaces of the substrate and on the inner surface. The metal circuit layer has a predetermined pattern for exposing a portion of the at least one of the upper and lower surfaces of the substrate and a portion of the inner surface.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

A method for manufacturing a conductive circuit board according to an embodiment of the present disclosure includes steps (a) to (e), which will be described in detail below in combination with FIGS. 2a to 2e.

Figure 1A:
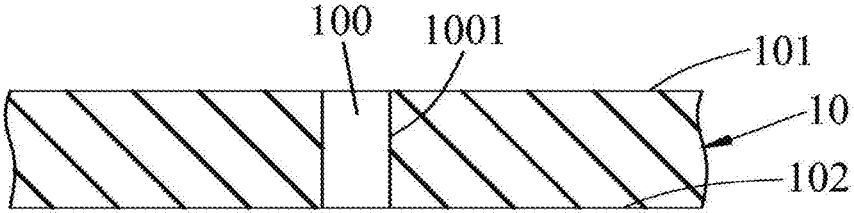
FIGS. 1A to 1G are fragmentary sectional views illustrating the steps involved in an existing method for manufacturing a direct plated copper (DPC) substrate.
Figure 1B:
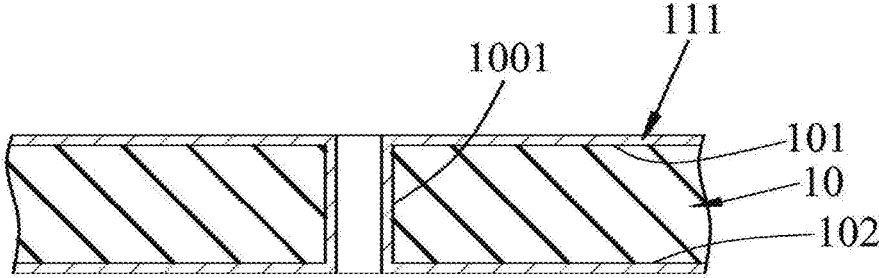
Figure 1C:
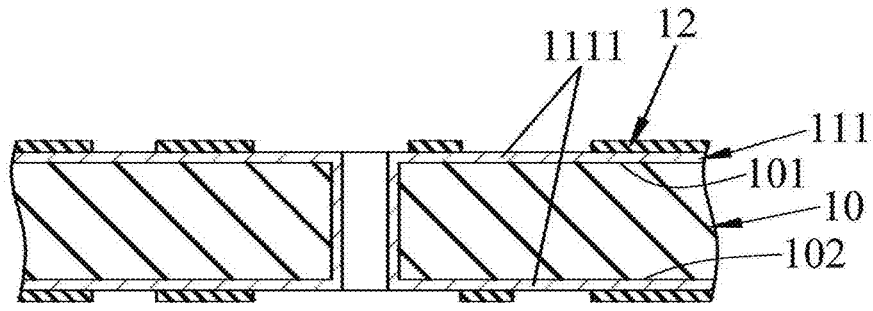
Figure 1D:
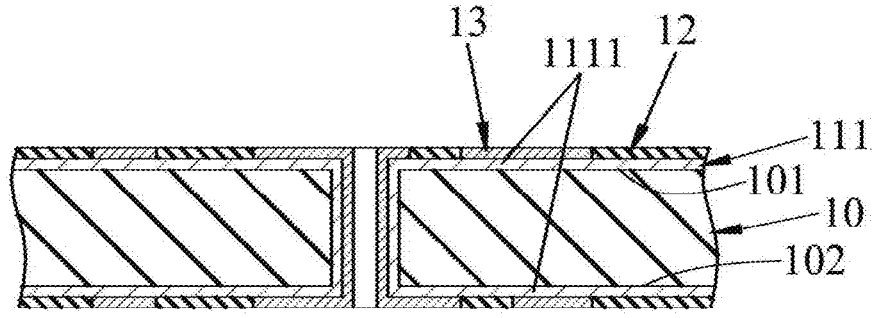
Figure 1E:
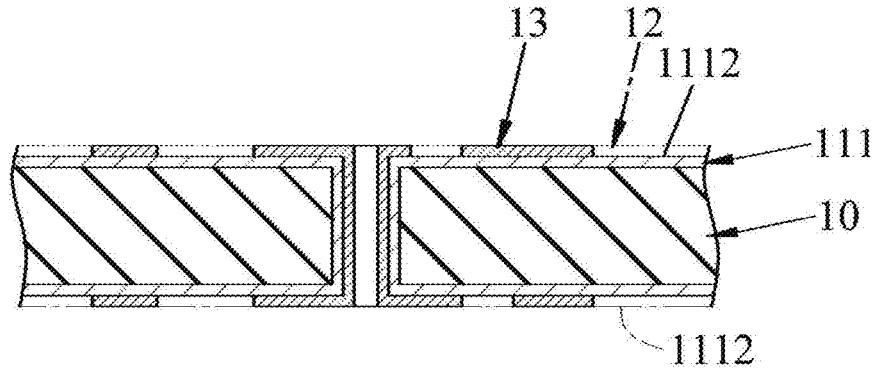
Figure 1F:
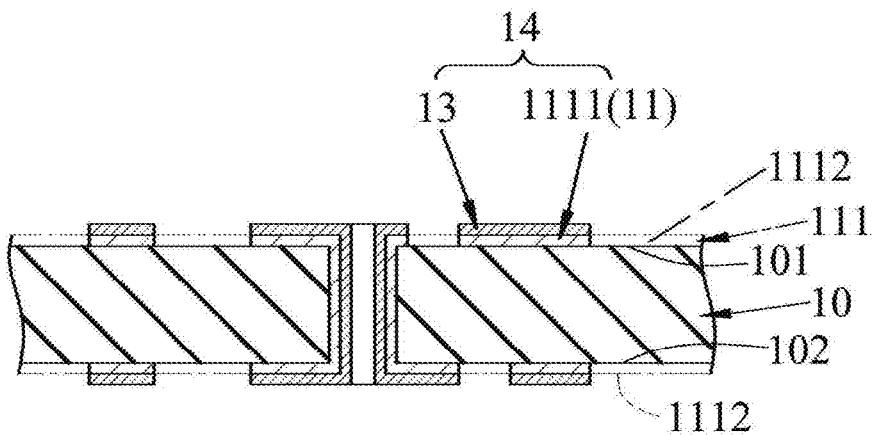
Figure 1G:
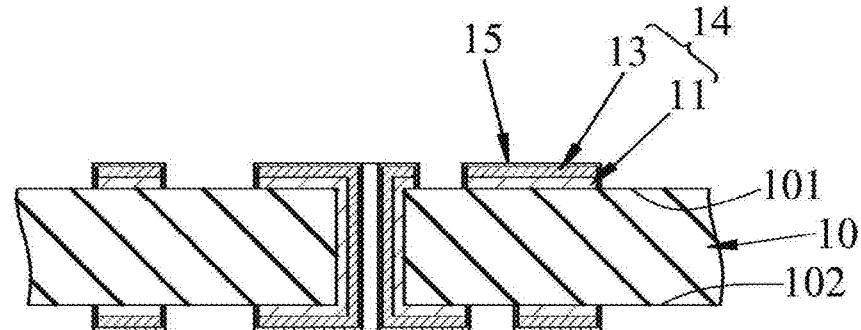
Figure 2A:
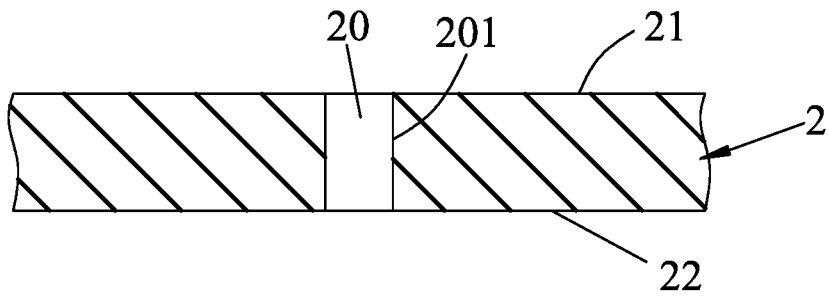
FIGS. 2a to 2e are fragmentary sectional views illustrating the steps involved in a method for manufacturing a conductive circuit board according to an embodiment of the present disclosure.
Figure 3:
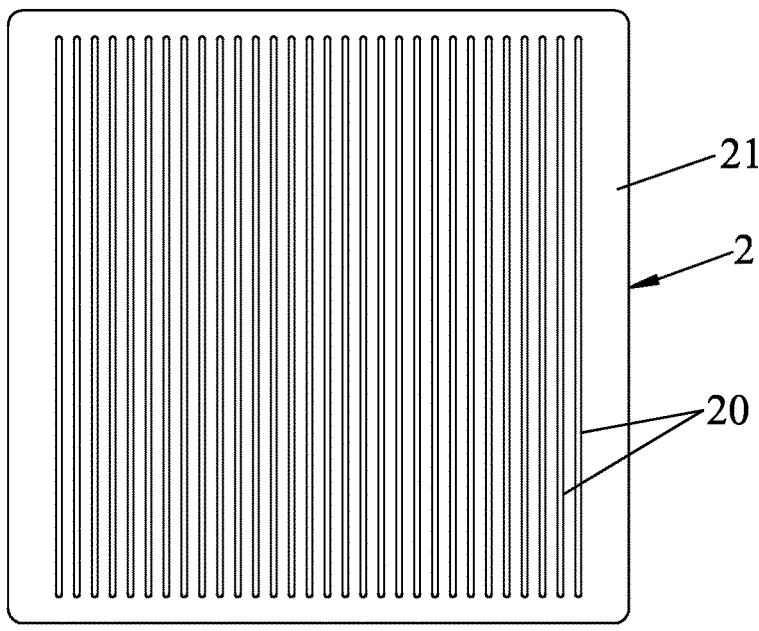
FIG. 3 is a schematic top view of a substrate prepared in step (a) of the embodiment.
Figure 4:
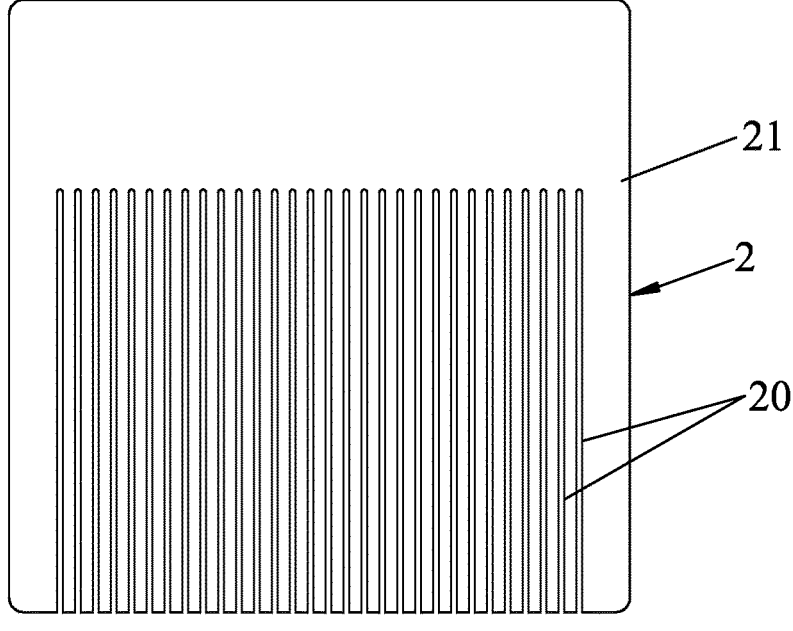
FIG. 4 is a schematic top view of an alternative form of the substrate.

In step (a), with reference to FIG. 2a, a substrate 2 is prepared. The substrate 2 has opposite upper and lower surfaces 21, 22, and a plurality of through holes 20 (only one through hole 20 is shown in FIGS. 2a to 2e to simplify the drawings) extending through the upper and lower surfaces 21, 22. Each through hole 20 is defined by an inner surface 201, and is formed by laser drilling or blade dicing. Each through hole 20 may be an elongated through hole having two opposite closed ends, as shown in FIG. 3, or one end closed and the other end open, as shown in FIG. 4. Further, the substrate 2 suitable for use in this step is made of an insulating material selected from the group consisting of ceramics and polymers. The substrate 2 made of a ceramic material is exemplified in this embodiment, but not limited thereto.

Figure 2B:
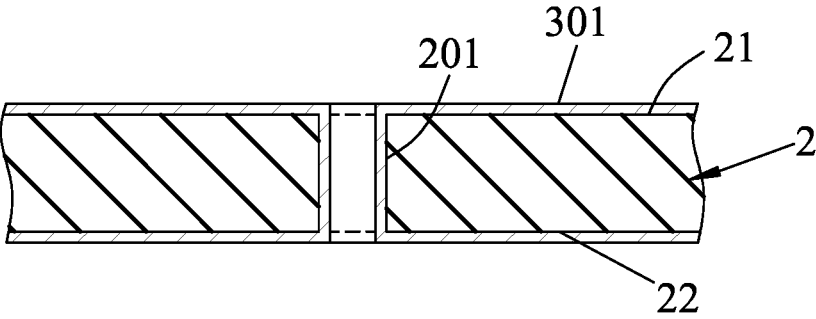

In step (b), with reference to FIG. 2b, a metal base layer 301 is formed on each of the upper and lower surfaces 21, 22 of the substrate 2 and on each inner surface 201 that defines each through hole 20. The metal base layer 301 may be formed by a physical vapor deposition (PVD) or chemical vapor deposition (CVD) method. In this embodiment, the metal base layer 301 is formed by a physical vapor deposition (PVD) method. The PVD method may be selected from one of sputtering and evaporation. In this step, the metal base layer 301 is a titanium-copper (Ti/Cu) multilayer film formed by sputtering, but not limited thereto.

Figure 2C:
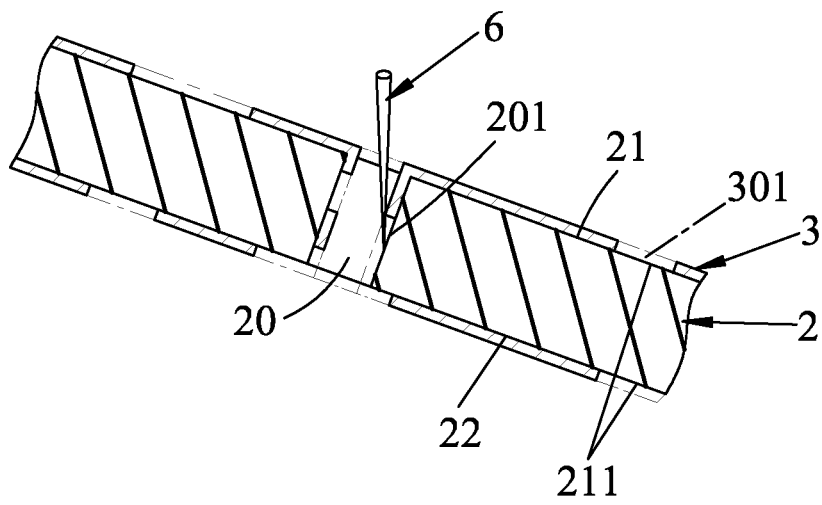

In step (c), with reference to FIG. 2c, the metal base layer 301 formed on each of the upper surface 21, the lower surface 22 and the inner surface 201 is etched by a laser beam 6, so that each of the upper surface 21, the lower surface 22, and the inner surface 201 forms a patterned metal base layer 3 having a predetermined pattern for exposing a portion 211 thereof. It should be noted that the wavelength, output power, frequency and moving speed of the laser beam 6 are adjusted according to the thickness and the material of the metal base layer 301. In this step, the laser beam 6 has a wavelength in the range of 157 nm to 10.6 μm, and an output power in the range of 2 W to 200 W. It should be further noted that, as shown in FIG. 2c, when the laser beam 6 is etching the metal base layer 301 formed on the inner surface 201, the substrate 2 is inclined at an angle relative to a ground surface (not shown), so that a travel path of an optical axis of the laser beam 6 can directly enter the through hole 20 to partially remove/etch away the metal base layer 301 formed on the inner surface 201.

The etching action performed by the laser beam 6 in step (c) is performed using a six-axis laser engraving machine (not shown). More specifically, the six-axis laser engraving machine can be used to adjust an angle between the optical axis of the laser beam 6 and each inner surface 201, so that the optical axis of the laser beam 6 can directly point to each inner surface 201 to partially etch away the metal base layer 301 formed thereon. When an aspect ratio of each through hole 20 is high, the substrate 2 can also be inclined at an angle so that the optical axis of the laser beam 6 can directly enter each through hole 20 to partially remove/etch away the metal base layer 301 formed on each inner surface 201.

Figure 2D:
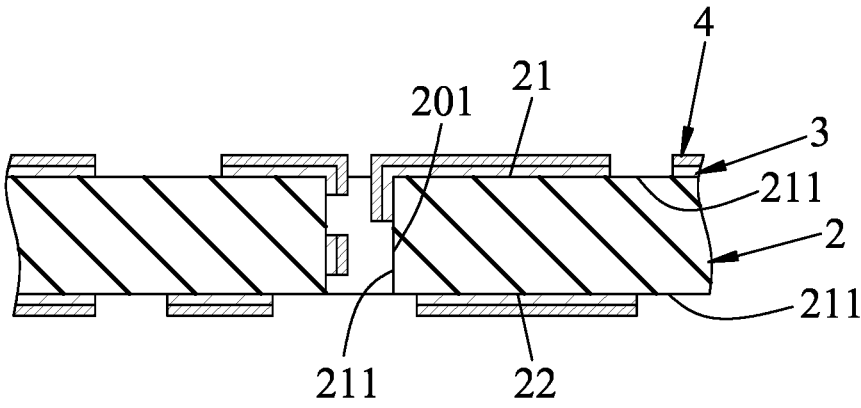

In step (d), with reference to FIG. 2d, the thickness of the patterned metal base layer 3 formed on each of the upper surface 21, the lower surface 22, and the inner surface 201 is increased to form a metal circuit layer 4. The means for increasing the thickness of the patterned metal base layer 3 suitable for this step may be selected from one of electroplating and chemical plating. In this embodiment, the means for increasing the thickness of the patterned metal base layer 3 is electroplating. It should be noted herein that the patterned metal base layer 3 obtained in step (c) is used as a seed layer when performing the electroplating of step (d). Specifically, in the whole process of electroplating, the thickness of the metal circuit layer 4 is increased according to the predetermined pattern of the patterned metal base layer (seed layer) 3. Therefore, the metal circuit layer 4 has a predetermined pattern that is identical to and that overlaps the predetermined pattern of the patterned metal base layer 3, and can also expose the portion 211 of each of the upper surface 21, the lower surface 22, and the inner surface 201.

Figure 2E:
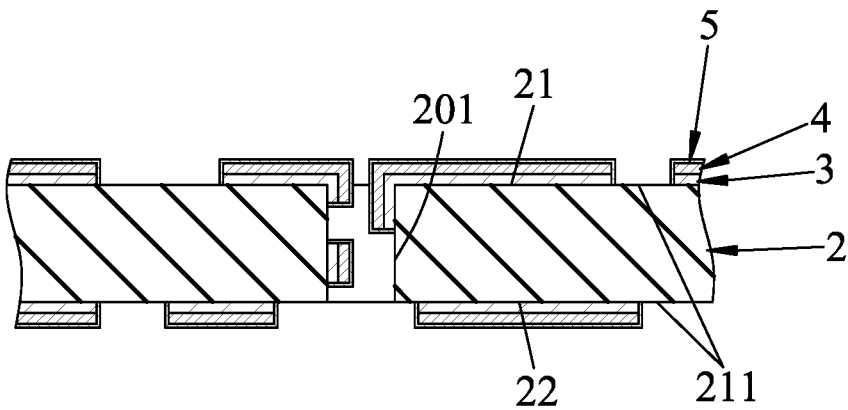

In step (e), with reference to FIG. 2e, a metal protective layer 5 is formed on the metal circuit layer 4 electroplated on the patterned metal base layer 3 formed on each of the upper surface 21, the lower surface 22, and the inner surface 201. The metal protective layer 5 is a film layer structure selected from the group consisting of nickel (Ni), silver (Ag), nickel/palladium/gold (Ni/Pd/Au), titanium/palladium/gold (Ti/Pd/Au), titanium/platinum/gold (Ti/Pt/Au), titanium/nickel/gold (Ti/Ni/Au), gold/palladium/gold (Au/Pd/Au), and nickel/gold (Ni/Au), but not limited thereto. The forming means suitable for this step may be selected from one of electroplating and chemical plating. In this embodiment, the forming means is electroplating. The metal protective layer 5 has a predetermined pattern that is identical to and that overlaps the predetermined pattern of the metal circuit layer 4, and can also expose the portion 211 of each of the upper surface 21, the lower surface 22, and the inner surface 201.

Figure 5:
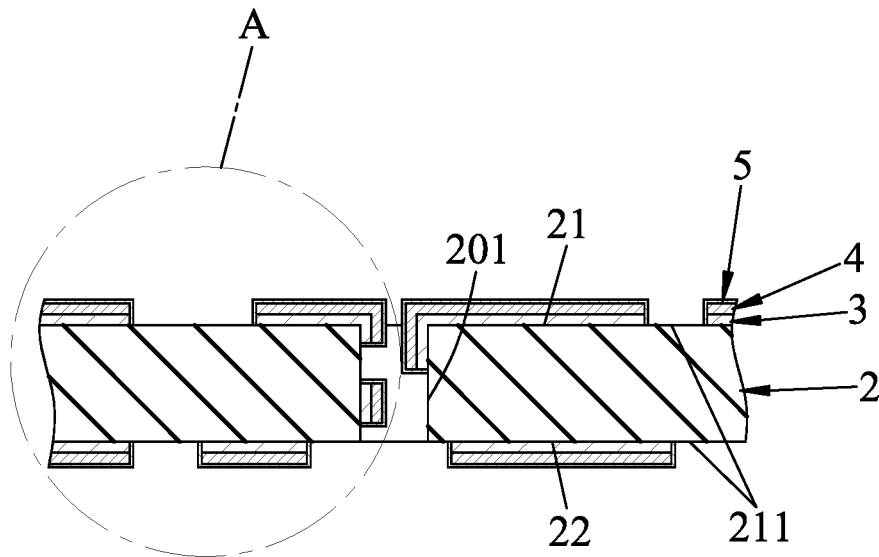
FIG. 5 is a fragmentary sectional view of the conductive circuit board obtained after step (e) of the embodiment.
Figure 6:
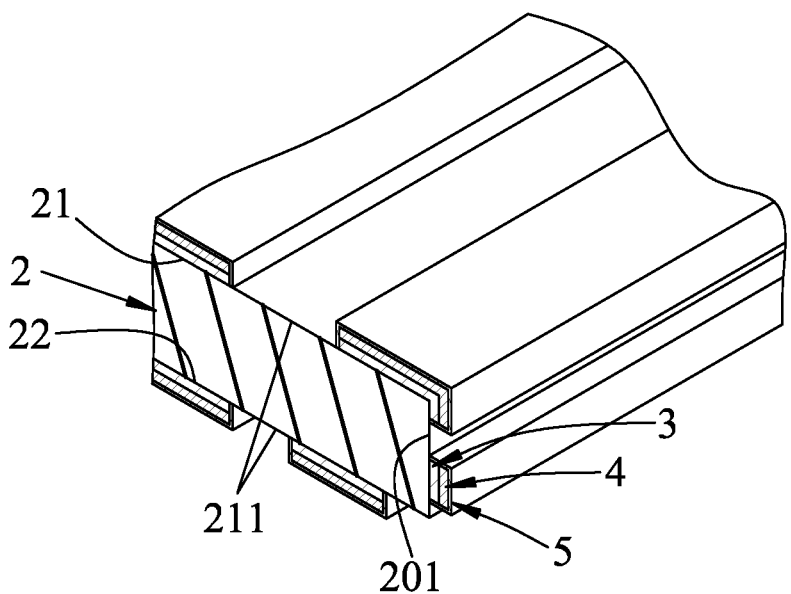
FIG. 6 is an enlarged perspective view of an encircled portion of FIG. 5.

Referring to FIGS. 5 and 6, it can be seen from the above detailed description that a conductive circuit board of this disclosure obtained by using the method of this embodiment includes the substrate 2, the patterned metal base layer 3, the metal circuit layer 4, and the metal protective layer 5.

Specifically, the substrate 2 has the opposite upper and lower surfaces 21, 22, and the through holes 20 extending through the upper and lower surfaces 21, 22 and respectively defined by the inner surfaces 201. The patterned metal base layer 3 is obtained by implementing the aforesaid steps (b) and (c), and is formed on each of the upper surface 21, the lower surface 22, and the inner surface 201. The patterned metal base layer 3 has a predetermined pattern that exposes the portion 211 of each of the upper surface 21, the lower surface 22, and the inner surface 201. The metal circuit layer 4 is formed on the patterned metal base layer 3, has a predetermined pattern that is identical to and that overlaps the predetermined pattern of the patterned metal base layer 3, and can also expose the portion 211 of each of the upper surface 21, the lower surface 22, and the inner surface 201. The metal protective layer 5 is formed on the metal circuit layer 4, has a predetermined pattern that is identical to and that overlaps the predetermined pattern of the metal circuit layer 4, and can also expose the portion 211 of each of the upper surface 21, the lower surface 22, and the inner surface 201.

From the above detailed description of the method and the conductive circuit board made therefrom, it can be seen that, not only the metal base layer 301 formed on each of the upper surface 21, the lower surface 22 and the inner surface 201 of the substrate 20 can be directly etched away through the laser beam 6 in step (c) to expose the portion 211 of each of the upper surface 21, the lower surface 22 and the inner surface 201, but also the six-axis laser engraving machine (not shown) can be used to adjust the angle between the optical axis of the laser beam 6 and each inner surface 201 of the substrate 2. Further, by tilting the substrate 2 at an angle, the optical axis of the laser beam 6 can directly point to each inner surface 201 to partially etch away the metal base layer 301 formed thereon. The manufacturing method of this embodiment does not need to perform the substep (C1) of attaching the dry film, the substep (C2) of exposing the dry film and the substep (C3) of developing the exposed dry film to obtain the patterned dry film 12 as described in the existing method for manufacturing a DPC substrate. There is also no need to perform the step (E) of stripping the patterned strip film 12 and the step (F) of etching away the portions 1111 of the metal base layer 111 at positions corresponding to where the patterned strip films 12 are stripped in the existing method. Compared with the existing method of manufacturing the DPC substrate, the manufacturing method of this disclosure can omit many steps of the existing manufacturing method. Moreover, the manufacturing method of this disclosure can also partially expose each inner surface 201 of the substrate 2 which can satisfy the requirements of the related industry who needs to design circuit patterns at the through holes 20 of the substrate 2.

In summary, the method of manufacturing the conductive circuit board not only has simple manufacturing steps, but also can meet the requirements of the downstream industry in circuit design. Therefore, the object of this disclosure can indeed be achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method for manufacturing a conductive circuit board, comprising the steps of:

(a) preparing a substrate, the substrate having an upper surface and a lower surface opposite to each other, and at least one through hole extending through the upper surface and the lower surface and defined by an inner surface;

(b) forming a metal base layer on at least one of the upper surface and the lower surface of the substrate and on the inner surface;

(c) etching the metal base layer formed on at least one of the upper surface and the lower surface of the substrate and on the inner surface by a laser beam, so that the at least one of the upper surface and the lower surface of the substrate and the inner surface are formed with a patterned metal base layer having a predetermined pattern for exposing a portion of the at least one of the upper surface and the lower surface of the substrate and a portion of the inner surface; and (d) forming a metal circuit layer on the at least one of the upper surface and the lower surface of the substrate and on the inner surface to increase a thickness of the patterned metal base layer formed on the at least one of the upper surface and the lower surface of the substrate and on the inner surface.

2. The method as claimed in claim 1, wherein, in step (c), the laser beam has a wavelength in the range of 157 nm to 10.6 μm.

3. The method as claimed in claim 2, wherein the laser beam has an output power in the range of 2 W to 200 W.

4. The method as claimed in claim 1, wherein, in step (a), the at least one through hole is formed by laser drilling or blade dicing.

5. The method as claimed in claim 1, further comprising step (e) after step (d), in which a metal protective layer is formed on the metal circuit layer of the at least one of the upper surface and the lower surface of the substrate and of the inner surface.

6. The method as claimed in claim 5, wherein the metal protective layer is a film layer structure selected from the group consisting of nickel, silver, nickel/palladium/gold, titanium/palladium/gold, titanium/platinum/gold, titanium/nickel/gold, gold/palladium/gold, and nickel/gold.

7. The method as claimed in claim 1, wherein, in step (b), the metal base layer is formed by a physical vapor deposition or chemical vapor deposition method.

8. The method as claimed in claim 7, wherein the metal base layer is formed by the physical vapor deposition method, and the physical vapor deposition method is selected from one of sputtering and evaporation.

9. The method as claimed in claim 1, wherein, in step (a), the substrate is made of an insulating material selected from the group consisting of ceramics and polymers.

10. A conductive circuit board, manufactured by implementing the method as claimed in claim 1.

* * * * *